US007910930B2

(12) United States Patent
Rho

(10) Patent No.: US 7,910,930 B2
(45) Date of Patent: Mar. 22, 2011

(54) THIN FILM TRANSISTOR AND THIN FILM TRANSISTOR DISPLAY PANEL HAVING A FRAME AND A LINE-SHAPED SEMICONDUCTOR

(75) Inventor: Soo-Guy Rho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 155 days.

(21) Appl. No.: 11/377,709

(22) Filed: Mar. 16, 2006

(65) Prior Publication Data

US 2006/0220015 A1 Oct. 5, 2006

(30) Foreign Application Priority Data

Mar. 17, 2005 (KR) .................. 10-2005-0022379

(51) Int. Cl.
  *H01L 29/04* (2006.01)
(52) U.S. Cl. .................. 257/72; 257/59; 257/E29.117; 349/58
(58) Field of Classification Search .................. 257/59, 257/E29.117, E29.273, E29.286, 57, 72; 438/149, 151; 349/42, 43, 58
See application file for complete search history.

(56) References Cited

U.S. PATENT DOCUMENTS

| | | | | |
|---|---|---|---|---|
| 5,892,558 A * | 4/1999 | Ge et al. | ................ | 349/43 |
| 5,904,515 A * | 5/1999 | Choi et al. | ................ | 438/197 |
| 5,962,863 A * | 10/1999 | Russell et al. | ................ | 257/14 |
| 5,998,838 A * | 12/1999 | Tanabe et al. | ................ | 257/347 |
| 6,195,138 B1 * | 2/2001 | Shimada et al. | ................ | 349/42 |
| 6,248,674 B1 | 6/2001 | Kamins et al. | ................ | 438/798 |
| 6,559,468 B1 | 5/2003 | Kuekes et al. | ................ | 257/14 |
| 6,699,779 B2 | 3/2004 | Chen et al. | ................ | 438/607 |
| 6,707,098 B2 | 3/2004 | Hofmann et al. | ................ | 257/324 |
| 6,741,019 B1 | 5/2004 | Filas et al. | ................ | 313/355 |
| 7,051,945 B2 * | 5/2006 | Empedocles et al. | ................ | 235/492 |
| 2002/0057407 A1 * | 5/2002 | Yamaguchi et al. | ................ | 349/117 |
| 2002/0109811 A1 * | 8/2002 | Park et al. | ................ | 349/113 |
| 2002/0153160 A1 | 10/2002 | Hofmann et al. | ................ | 174/117 F |
| 2003/0098488 A1 * | 5/2003 | O'Keeffe et al. | ................ | 257/401 |
| 2003/0128329 A1 * | 7/2003 | Kim | ................ | 349/187 |
| 2003/0186522 A1 | 10/2003 | Duan et al. | ................ | 438/584 |
| 2004/0021413 A1 * | 2/2004 | Ito et al. | ................ | 313/504 |
| 2004/0084691 A1 | 5/2004 | Chen et al. | ................ | 257/192 |
| 2004/0105053 A1 * | 6/2004 | Ozeki et al. | ................ | 349/112 |
| 2004/0112964 A1 | 6/2004 | Empedocles et al. | | |
| 2004/0188721 A1 | 9/2004 | Lieber et al. | ................ | 257/211 |
| 2005/0079659 A1 * | 4/2005 | Duan et al. | ................ | 438/197 |
| 2005/0162080 A1 * | 7/2005 | Yaegashi | ................ | 313/504 |
| 2006/0008942 A1 * | 1/2006 | Romano et al. | ................ | 438/99 |
| 2006/0017106 A1 * | 1/2006 | Suh et al. | ................ | 257/347 |
| 2006/0081886 A1 * | 4/2006 | Mostarshed et al. | ................ | 257/213 |
| 2006/0226425 A1 * | 10/2006 | Chae et al. | ................ | 257/59 |
| 2006/0231957 A1 * | 10/2006 | Kim et al. | ................ | 257/759 |
| 2007/0210702 A1 * | 9/2007 | Nakamura | ................ | 313/504 |
| 2010/0214513 A1 * | 8/2010 | Kang et al. | ................ | 349/86 |

FOREIGN PATENT DOCUMENTS

| | | |
|---|---|---|
| JP | 2004-122283 | 4/2004 |
| JP | 2004-345934 | 12/2004 |
| KR | 2001-0051096 | 6/2001 |
| KR | 2003-0043938 | 6/2003 |
| KR | 2003-0061850 | 7/2003 |
| KR | 10-2004-0098623 | 11/2004 |
| WO | WO 200051186 A1 * | 8/2000 |

\* cited by examiner

*Primary Examiner* — Leonardo Andújar
*Assistant Examiner* — Christopher M Roland
(74) *Attorney, Agent, or Firm* — Cantor Colburn LLP

(57) ABSTRACT

A thin film transistor is provided. The thin film transistor includes a frame formed on a substrate and having a plurality of grooves, line-shaped semiconductors disposed in at least one of the grooves, a first electrode overlapping with the line-shaped semiconductors, and second and third electrodes connected to ends of the line-shaped semiconductors.

14 Claims, 21 Drawing Sheets

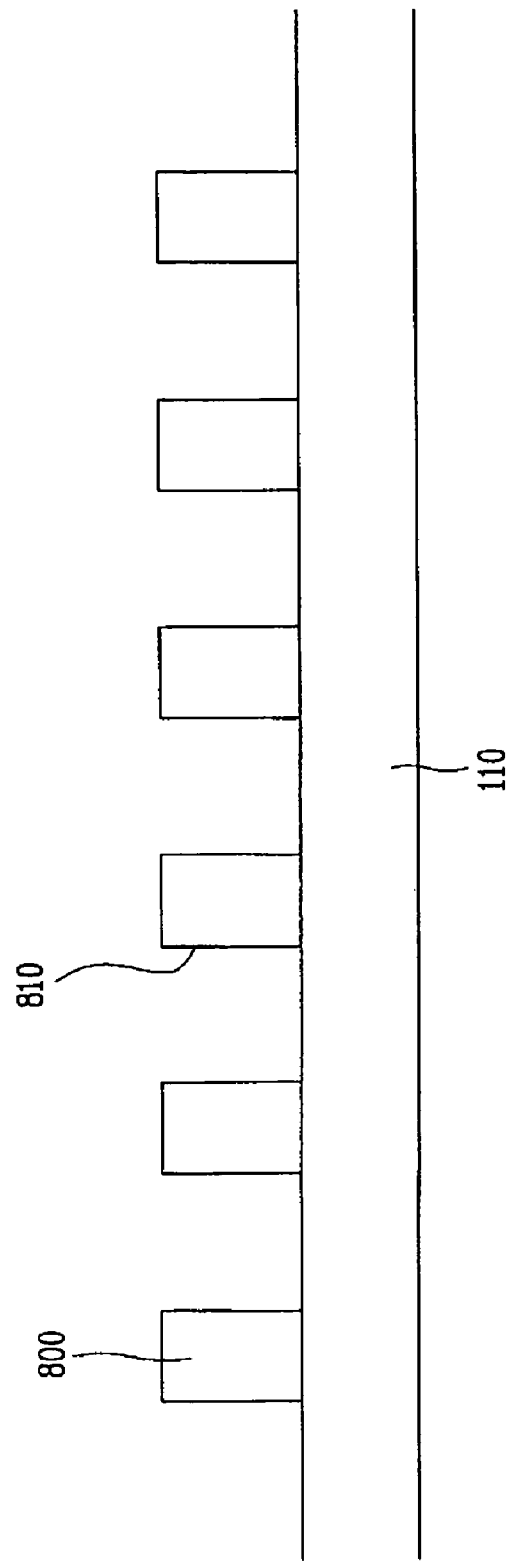

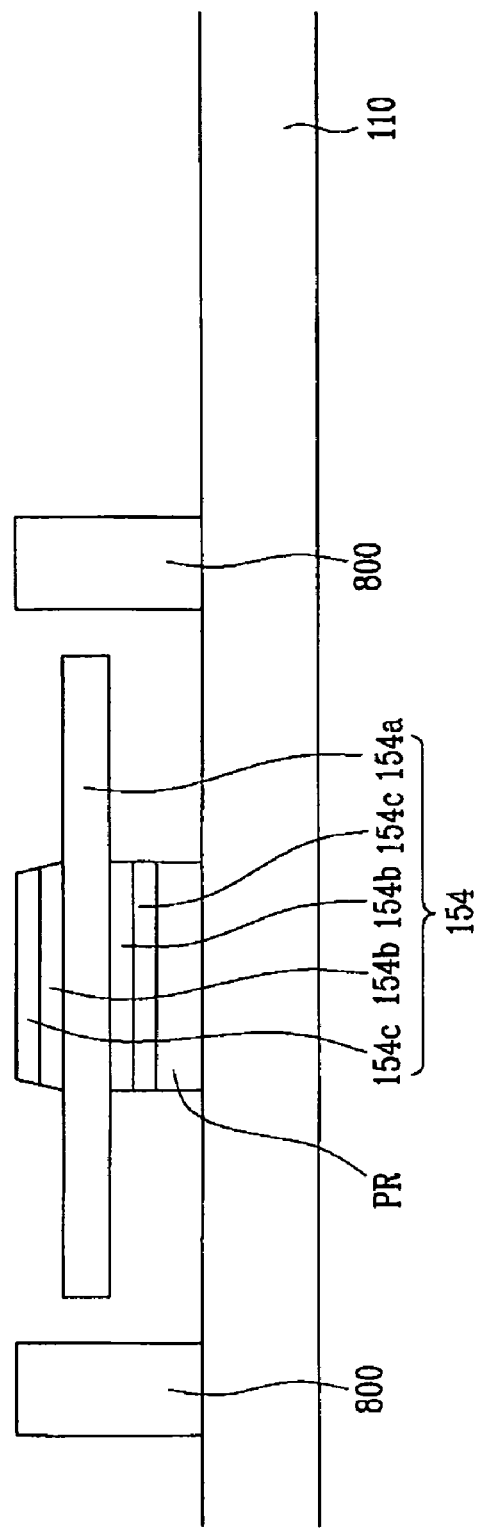

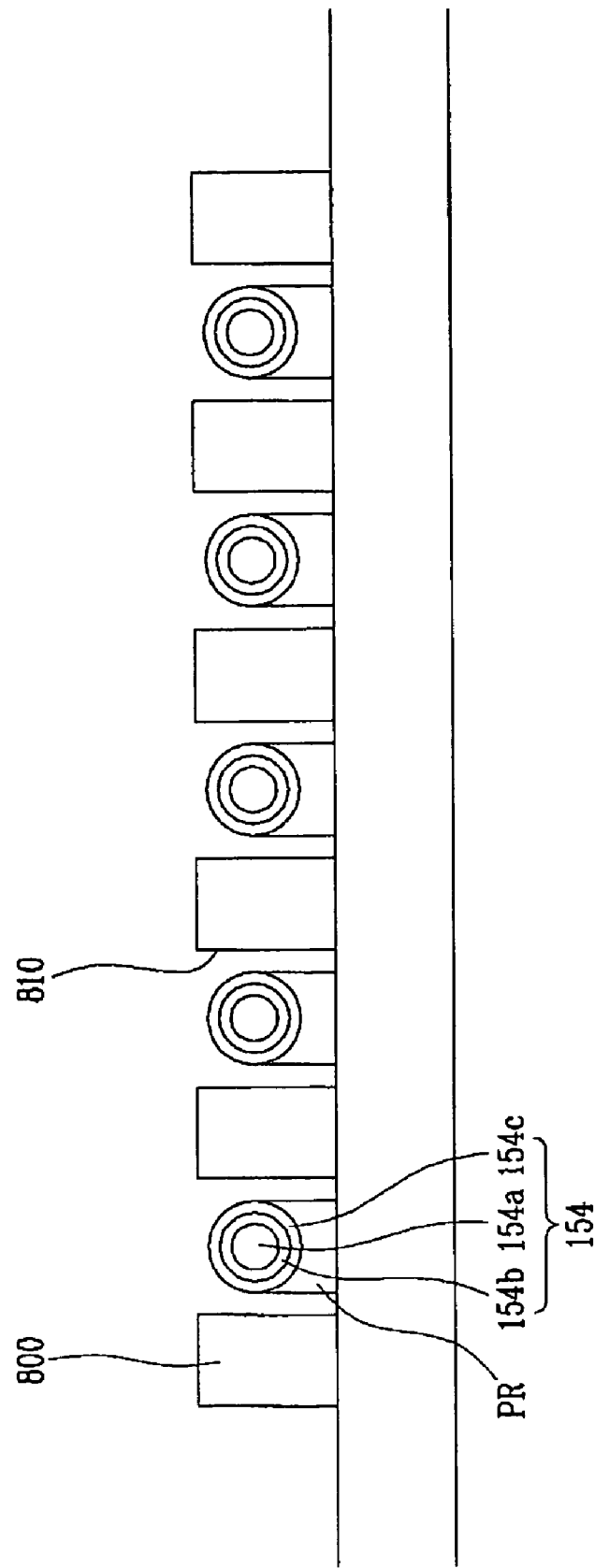

*FIG. 9*
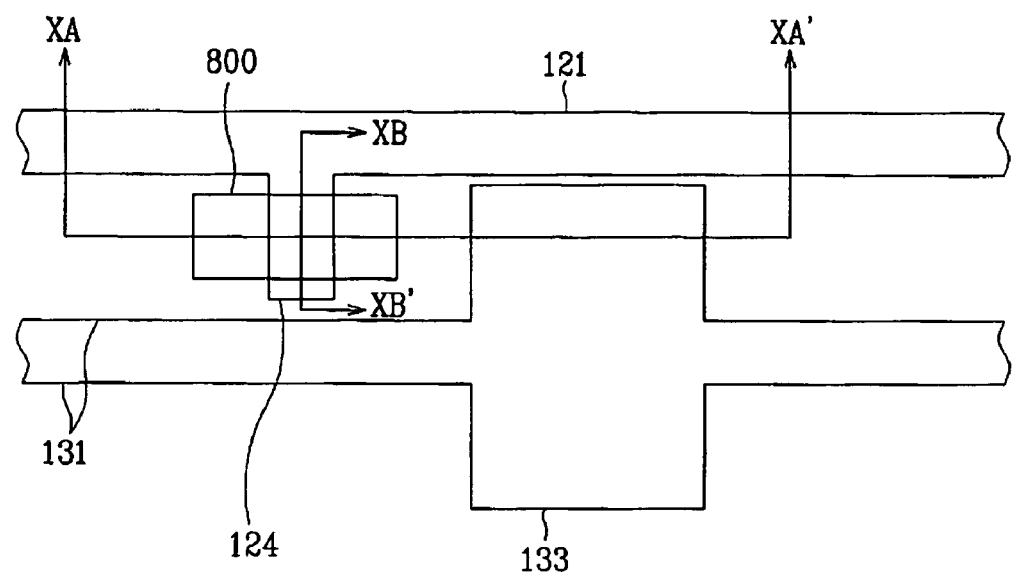
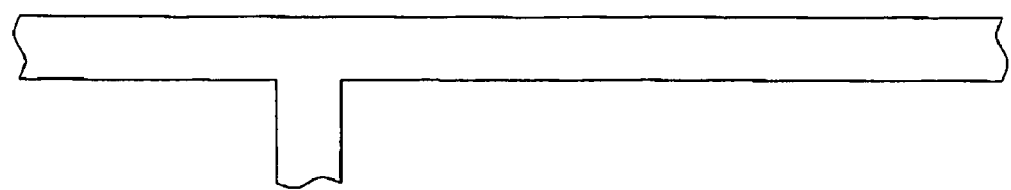

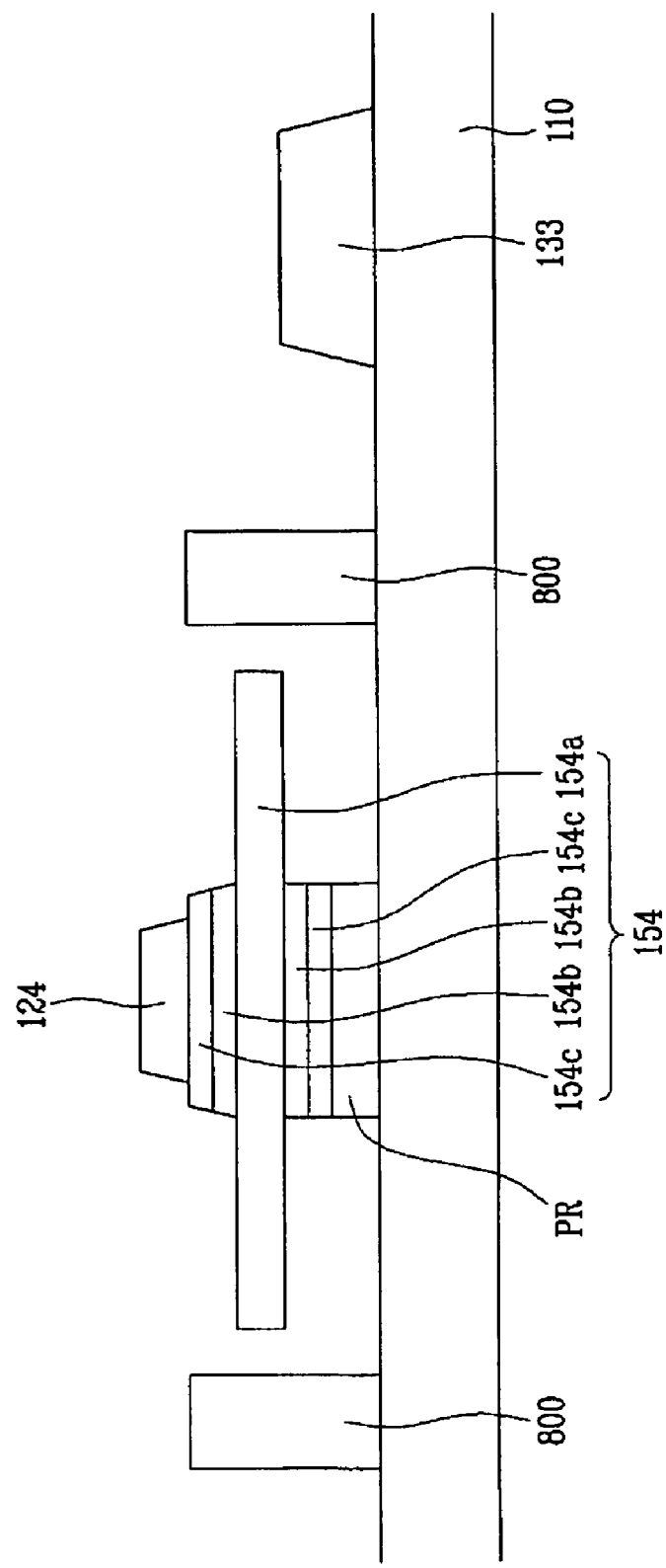

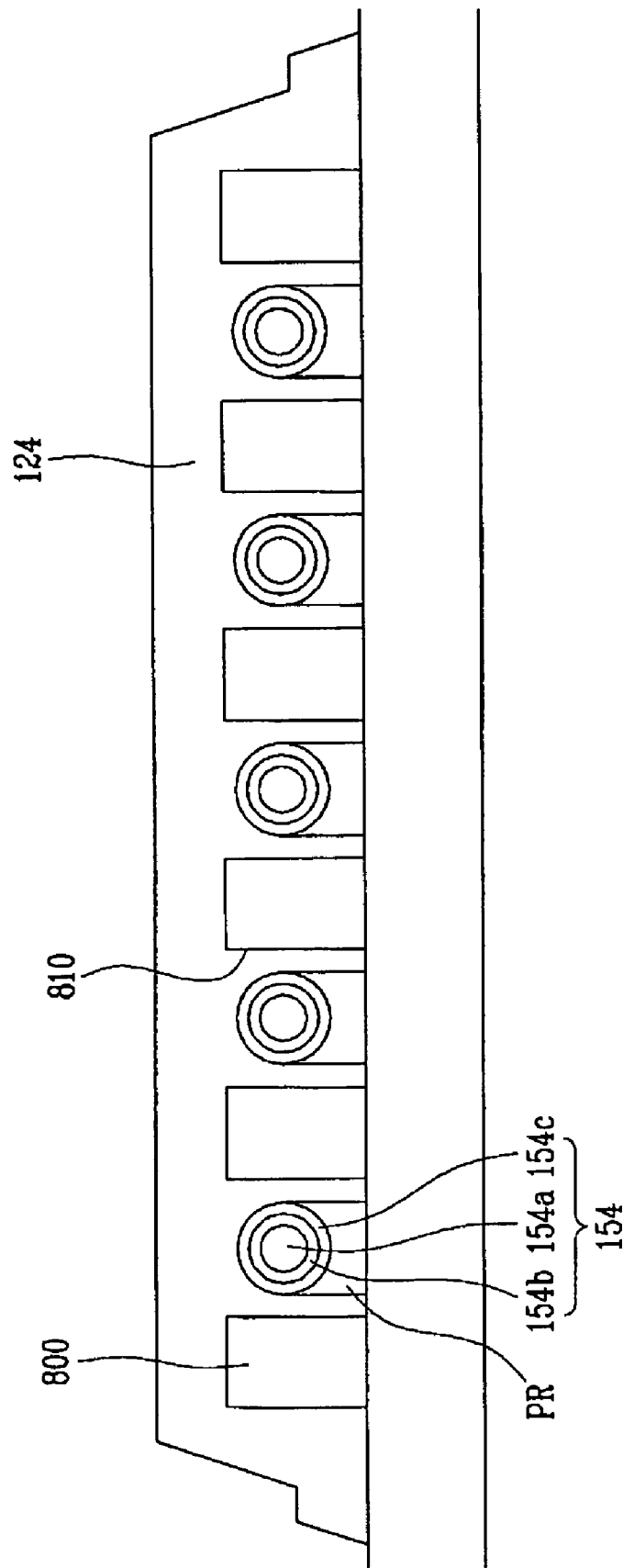

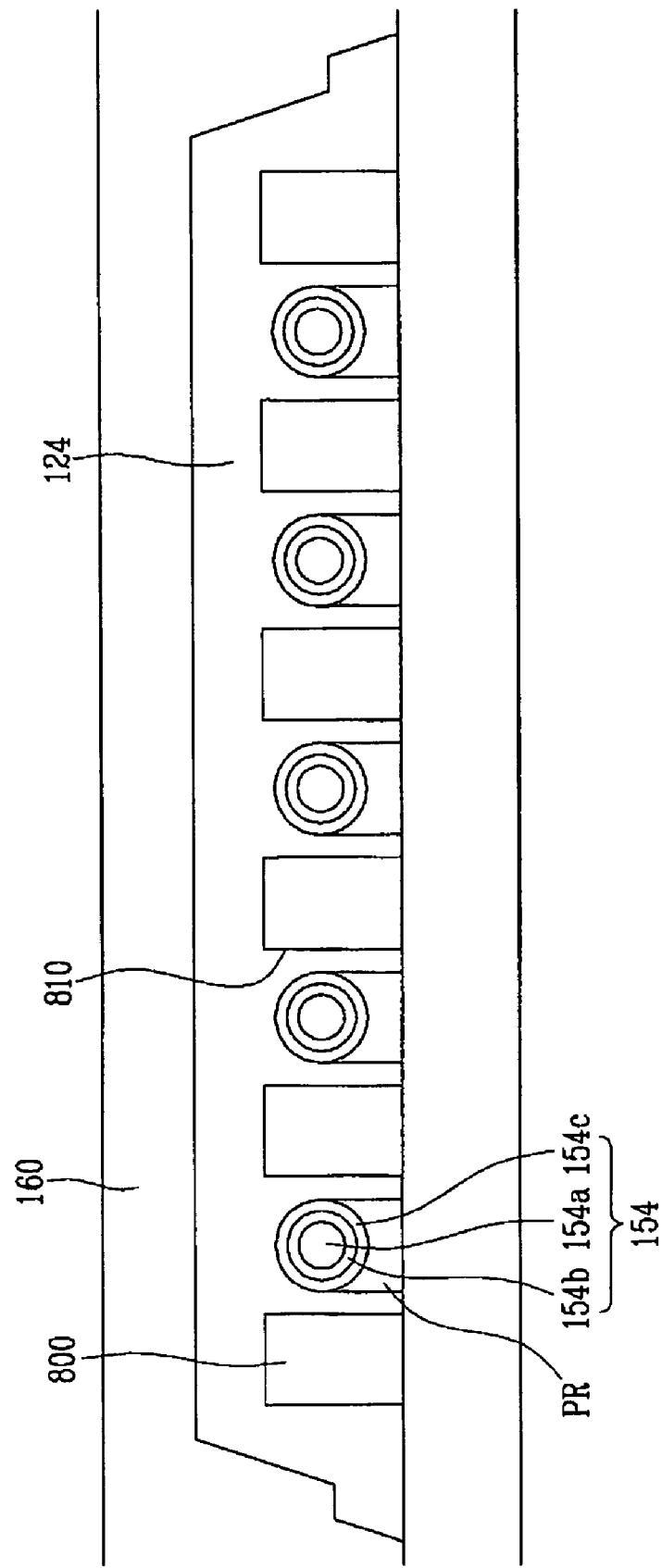

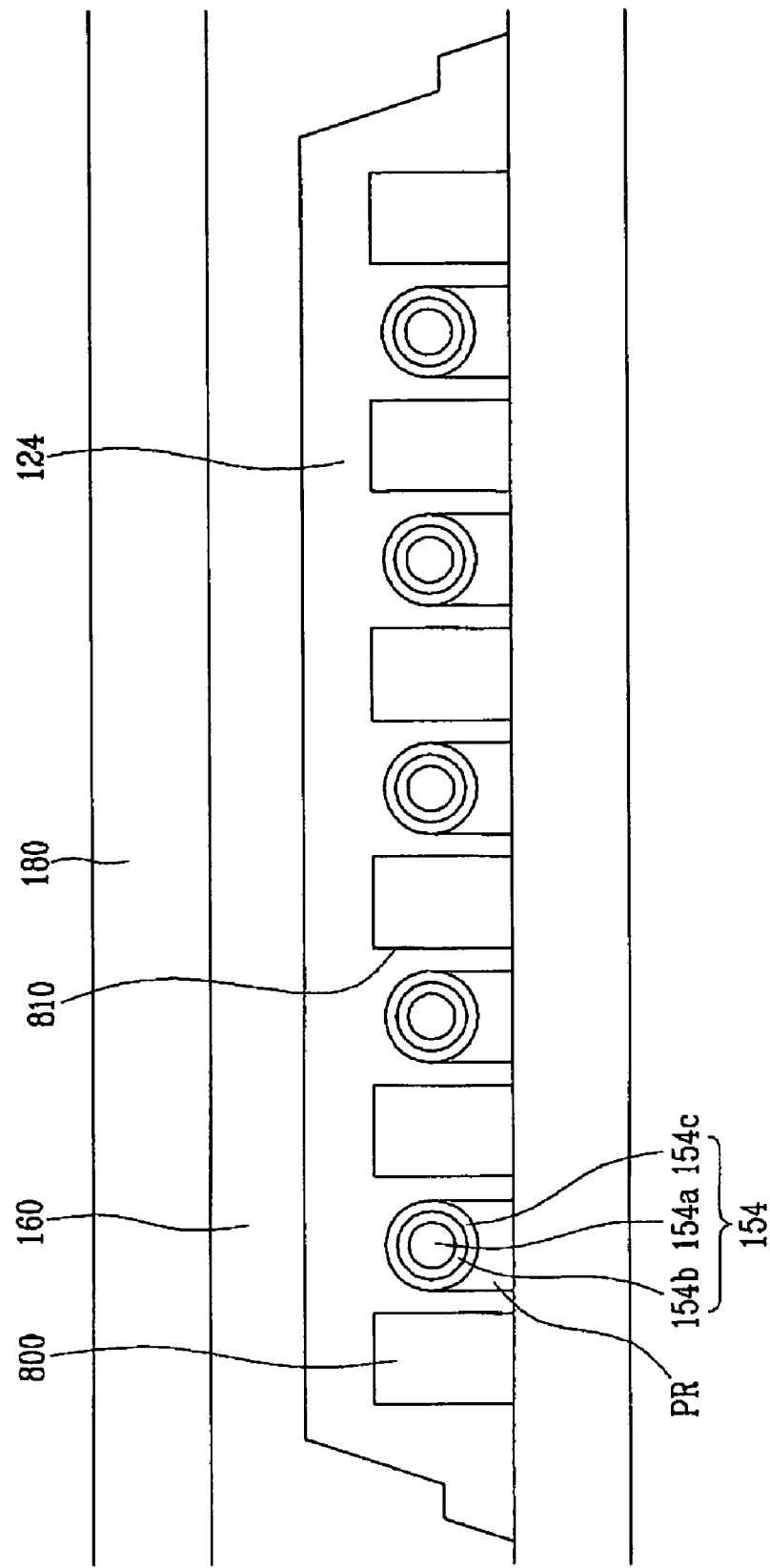

US 7,910,930 B2

THIN FILM TRANSISTOR AND THIN FILM TRANSISTOR DISPLAY PANEL HAVING A FRAME AND A LINE-SHAPED SEMICONDUCTOR

This application claims priority to Korean Patent Application No. 2005-0022379, filed on Mar. 17, 2005, and all the benefits accruing therefrom under 35 U.S.C. §119, and the contents of which in its entirety are herein incorporated by reference.

BACKGROUND OF THE INVENTION (a) Field of the Invention

The present invention relates to a thin film transistor, a thin film transistor display panel, and a manufacturing method thereof, and more particularly to a thin film transistor having crystalline silicon, a thin film transistor display panel having the thin film transistor, and a manufacturing method thereof.

(b) Description of the Related Art

In general, a thin film transistor (TFT) is used as a switching device for independently driving pixels in a flat display apparatus such as a liquid crystal display (LCD) apparatus and an organic light emitting display (OLED) apparatus. A thin film transistor display panel includes the thin film transistors, pixel electrodes connected to the thin film transistors, scan signal lines (or gate lines) for transmitting scan signals to the thin film transistors, and data lines for transmitting data signals.

Each of the thin film transistors includes a gate electrode connected to the gate line, a source electrode connected to the data line, a drain electrode connected to the pixel electrode, and a semiconductor disposed on the gate electrode between the source and drain electrodes. The thin film transistors transmit the data signals from the data lines to the pixel electrodes according to the scan signals from the gate lines. Here, the semiconductor of the thin film transistor is made of polysilicon or amorphous silicon.

In general, silicon is classified as amorphous silicon and polysilicon according to the crystalline state thereof. Since the amorphous silicon can be deposited at a low temperature to form a thin film, the amorphous silicon is mainly used for a display apparatus in which a glass having a low melting point is used as a substrate. However, in comparison to the crystalline silicon, due to a low field effect mobility of the amorphous silicon, it is difficult to implement a Chip-In-Glass by directly designing and forming a driving circuit on a panel for the display apparatus. Therefore, production cost thereof increases.

On the other hand, although the polysilicon has better field effect mobility than the amorphous silicon, a process for forming the polysilicon is very complicated.

SUMMARY OF THE INVENTION

An exemplary embodiment provides a thin film transistor having high electric mobility and that is capable of minimizing production cost, a thin film transistor display panel having the thin film transistor, and a method of manufacturing the thin film transistor.

Another exemplary embodiment provides a method of manufacturing a thin film transistor that is capable of forming a semiconductor of the thin film transistor by using a line-shaped semiconductor (nanowire).

In an exemplary embodiment according to the present invention, there is provided a thin film transistor including a frame formed on a substrate and having a plurality of grooves, line-shaped semiconductors disposed in at least one of the grooves, a first electrode overlapping with the line-shaped semiconductors, and second and third electrodes connected to ends of the line-shaped semiconductors.

In another exemplary embodiment according to the present invention, there is provided a thin film transistor display panel including a substrate, a frame formed on the substrate and having a plurality of grooves, a line-shaped semiconductor disposed in at least one of the grooves, a gate line overlapping with the line-shaped semiconductors, a data line and a drain electrode connected to ends of the line-shaped semiconductors, and a pixel electrode connected to the drain electrode.

In another exemplary embodiment according to the present invention, there is provided a method of manufacturing a thin film transistor display panel, including forming a frame having a plurality of grooves on a substrate; disposing line-shaped semiconductors into the grooves; forming a gate line overlapping with the line-shaped semiconductors; forming a data line and a drain electrode insulated from the gate line and intersecting the gate line, wherein the data line and the drain electrode are connected to ends of the line-shaped semiconductors; and forming a pixel electrode connected to the drain electrode.

BRIEF DESCRIPTION OF THE DRAWINGS

The above and other features and advantages of the present invention will become more apparent by describing in detail exemplary embodiments thereof with reference to the attached drawings, in which:

FIGS. 6A and 6B are cross-sectional views of the thin film transistor display panel taken along lines VIA-VIA' and VIB-VIB' of FIG. 5, respectively;

FIGS. 8A and 8B are cross-sectional views of the thin film transistor display panel showing exemplary embodiments of steps of a manufacturing method following steps shown in FIGS. 7A and 7B;

FIG. 9 is a layout view showing an exemplary embodiment of the thin film transistor display panel in an exemplary embodiment of a step of a manufacturing method following the steps shown in FIGS. 8A and 8B;

FIGS. 10A and 10B are cross-sectional views of the thin film transistor display panel taken along lines XA-XA' and XB-XB' of FIG. 9, respectively;

FIGS. 12A and 12B are cross-sectional views of the thin film transistor display panel taken along lines XIIA-XIIA' and XIIB-XIIB' of FIG. 11, respectively;

FIGS. 14A and 14B are cross-sectional views of the thin film transistor display panel taken along lines XIVA-XIVA' and XIVB-XIVB' of FIG. 13, respectively.

DETAILED DESCRIPTION OF THE INVENTION

Figure 1:
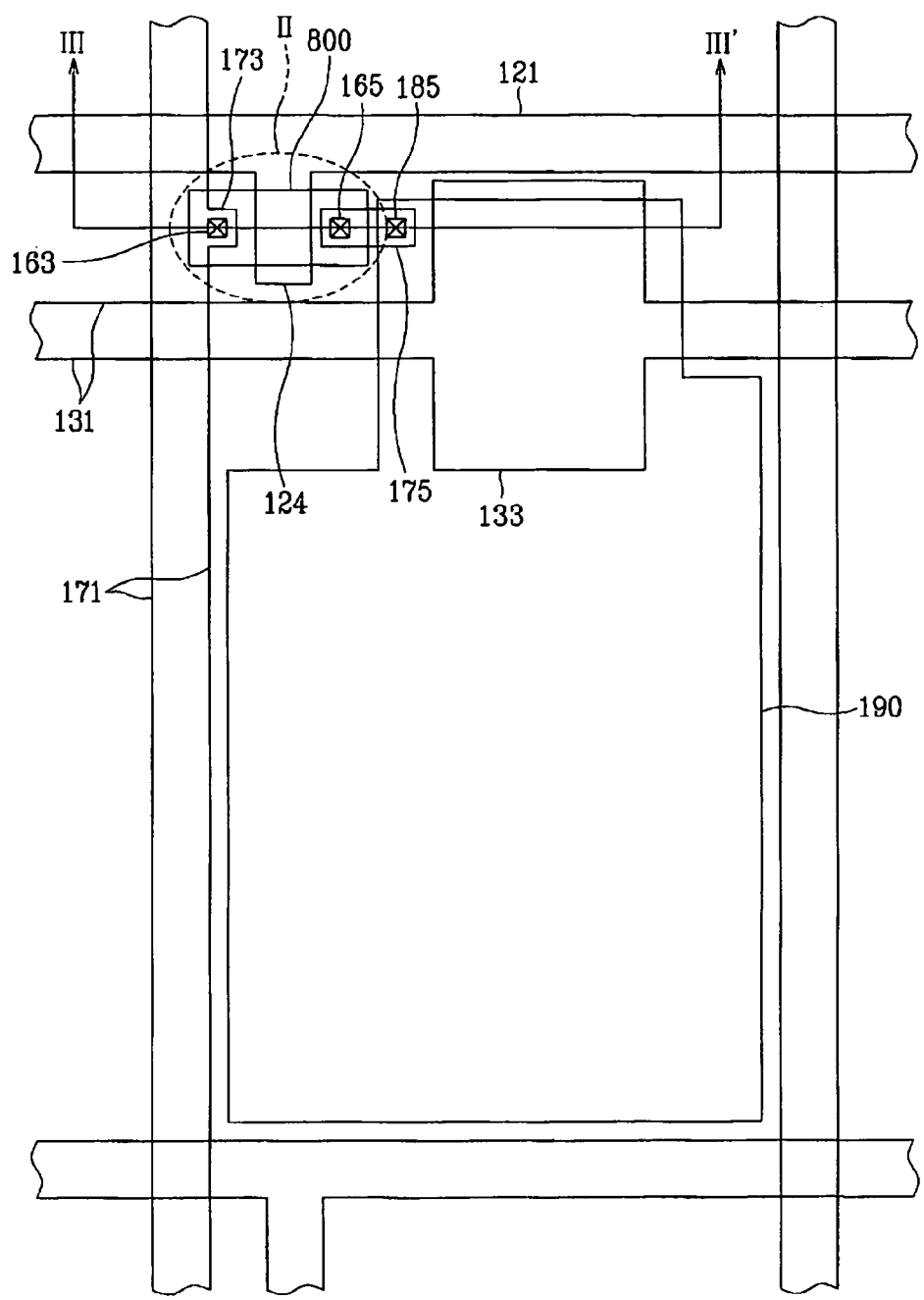
FIG. 1 is a layout view showing an exemplary embodiment of a pixel in a thin film transistor display panel for a liquid crystal display apparatus according to the present invention.

Hereinafter, exemplary embodiments of the present invention will be described in detail with reference to the attached drawings such that the present invention can be easily put into practice by those skilled in the art. However, the present invention may be implemented in various aspects. The present invention is not limited to embodiments described hereinafter.

In the drawings, thicknesses are enlarged for the purpose of clearly illustrating layers and areas. In addition, like elements are denoted by like reference numerals in the whole specification. If it is mentioned that a layer, a film, an area, or a plate is placed on a different element, it includes a case that the layer, film, area, or plate is placed right on the different element, as well as a case that another element is disposed therebetween. On the contrary, if it is mentioned that one element is placed right on another element, it means that no element is disposed therebetween. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of upper and lower. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Now, exemplary embodiments of a thin film transistor, a thin film transistor display panel, and a manufacturing method thereof according to the present invention will be described with reference to the accompanying drawings.

Figure 2:
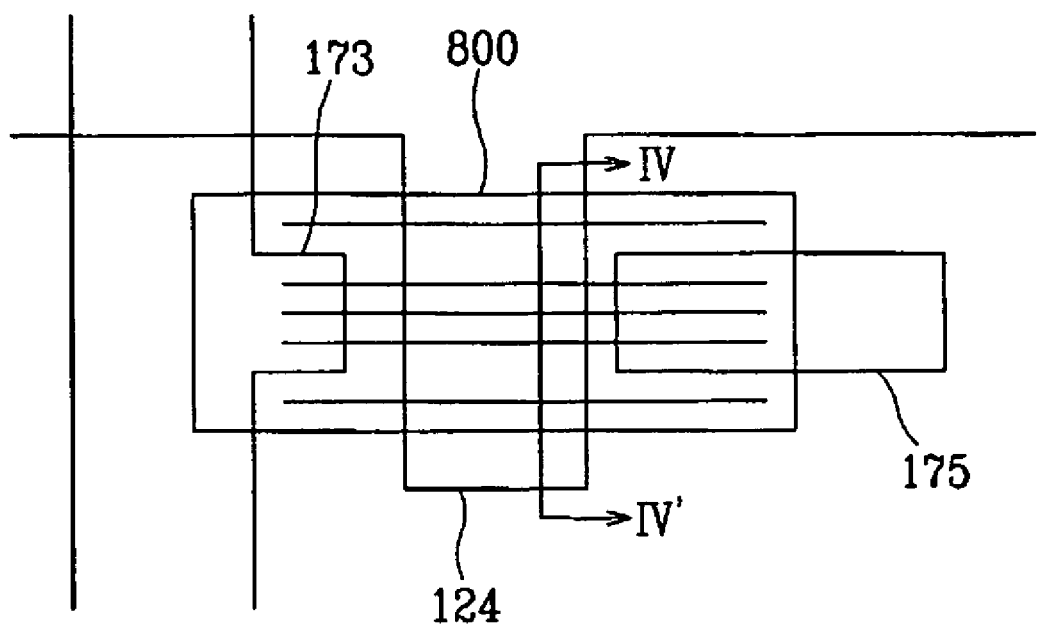
FIG. 2 is an enlarged layout view showing a portion II of the thin film transistor display panel shown in FIG. 1.
Figure 3:
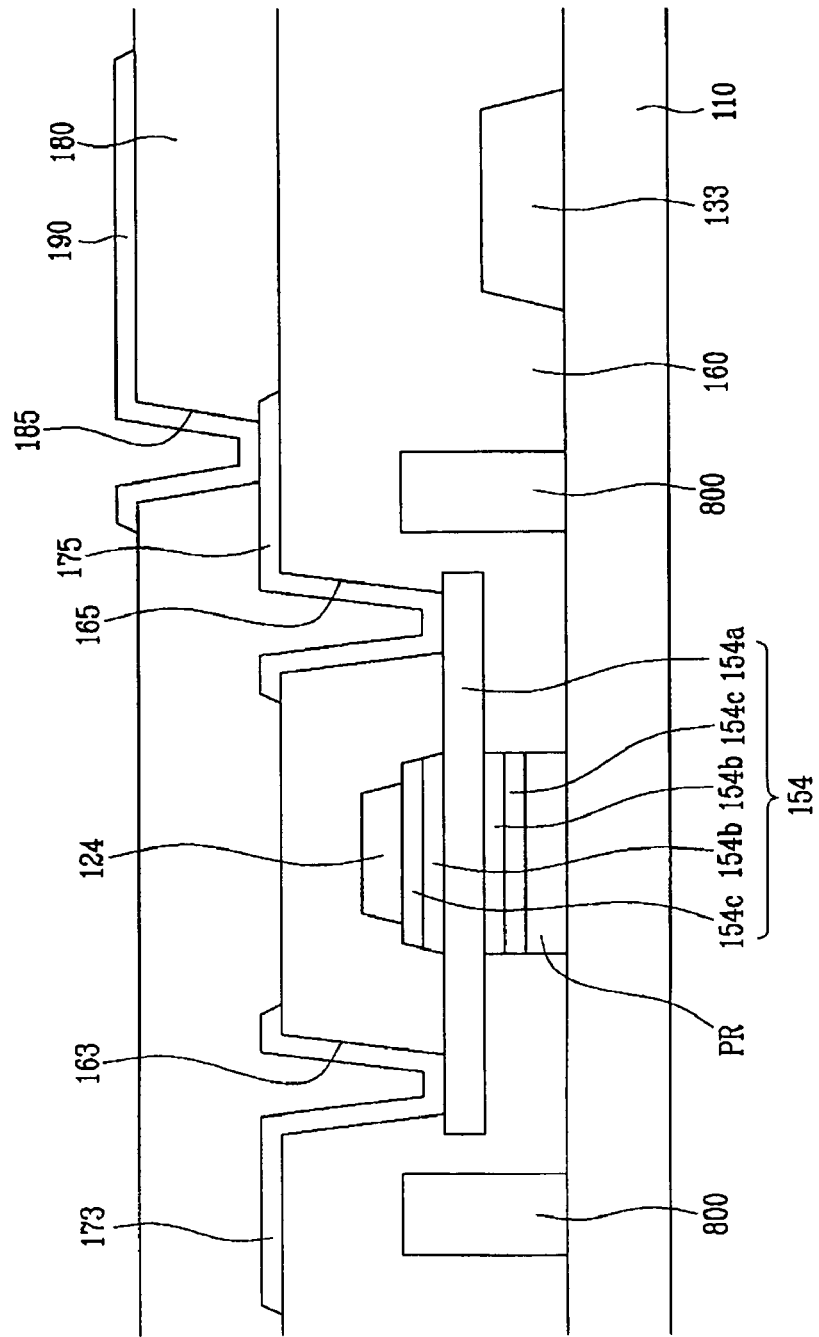
FIG. 3 is a cross sectional view of the thin film transistor display panel taken along line III-III' of FIG. 1.
Figure 4:
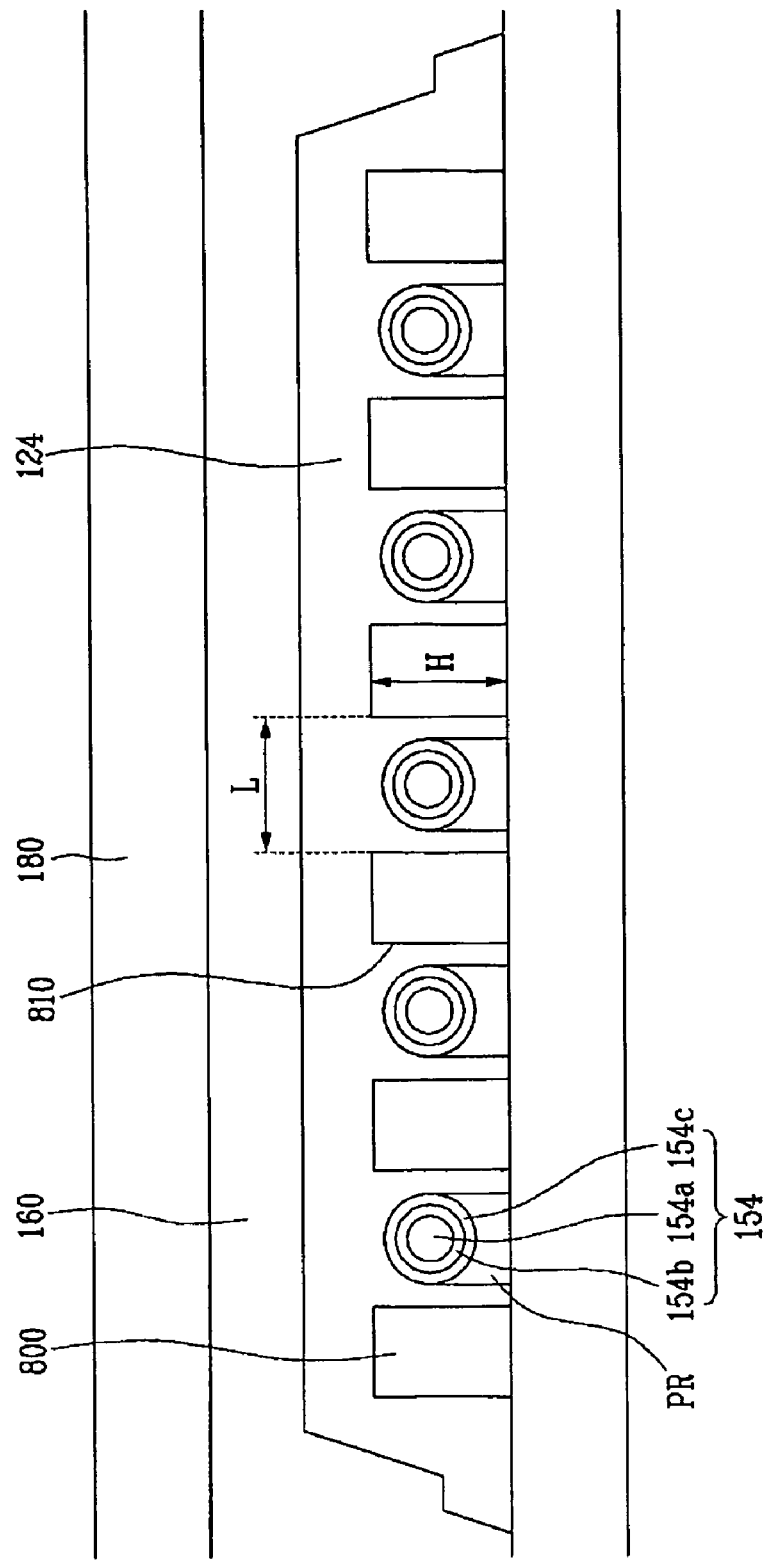
FIG. 4 is a cross-sectional view taken along line IV-IV' of FIG. 2.

An exemplary embodiment of a thin film transistor display panel for a display apparatus according to the present invention will be described in detail with reference to FIGS. 1 to 4. FIG. 1 is a layout view showing an exemplary embodiment of a pixel in a thin film transistor display panel for the liquid crystal display apparatus according to the present invention, FIG. 2 is a enlarged layout view showing a portion II of the thin film transistor display panel shown in FIG. 1, FIG. 3 is a cross-sectional view of the thin film transistor display panel taken along line III-III' of FIG. 1, and FIG. 4 is a cross-sectional view taken along line IV-IV' of FIG. 2.

Referring to FIGS. 1 to 4, a plurality of frames 800 made of a transparent organic material are formed on a transparent dielectric substrate 110. Each of the frames 800 has a plurality of grooves H. The grooves 810 are aligned to be substantially parallel to each other in longitudinal and transverse directions. In exemplary embodiments, a height H of each of the grooves 810 may be 2 μm or less. An interval L between adjacent grooves 810 may be in a range of about 2 μm to about 4 μm. In another exemplary embodiment, the interval L between adjacent grooves 810 may be in a range of about 2 μm to about 3 μm In other exemplary embodiments, lengths of sides of a planar pattern of the frames 800 in a direction substantially perpendicular to the interval L are in a range of 4 μm to 10 μm.

The grooves 810 are filled with a plurality of line-shaped semiconductors extending substantially in a longitudinal direction of the grooves 810. Each of the line-shaped semiconductors (nanowires) 154 includes a core 154a, an insulating layer 154b surrounding the core 154a, and a conductive layer 154c surrounding the insulating layer 154b. The core may include, but is not limited to, a single crystal. In exemplary embodiments, the core 154a may be exposed by removing a portion of the conductive member 154c and the insulating layer 154b disposed at both ends of each of the line-shaped semiconductors 154.

The insulating layer 154b surrounding the core 154a of the semiconductors 154 is essentially used as a gate insulating layer of the thin film transistor.

A plurality of gate lines 121 and storage electrode lines 131 extending substantially in the longitudinal direction are formed on the substrate 110. The gate lines 121 transmits gate signals, and include a plurality of gate electrodes 124. Referring to FIG. 1, the gate electrodes 124 extend downwardly from the gate lines 121 in a direction substantially perpendicular to the gate lines 121 and overlap with the line-shaped semiconductors 154. The gate electrodes 124 protrude in a longitudinal direction that is substantially perpendicular to the grooves 810.

The storage electrode lines 131 receive predetermined voltages such as a common voltage applied to a common electrode (not shown). The storage electrode lines 131 include storage electrodes 133. Referring again to FIG. 1, the storage electrodes 133 protrude from opposite sides of the storage electrode lines 131 in a direction substantially perpendicular to the storage electrode lines 131, essentially being "enlarged in upward and downward direction" from the storage electrode lines 131.

In exemplary embodiments, the gate lines 121 and the storage electrode lines 131 may be made of a molybdenum-based metal such as molybdenum (Mo) and a molybdenum alloy, a refractory metal such as chromium (Cr), titanium (Ti), or tantalum (Ta), and alloys thereof. In alternative exemplary embodiments, the gate lines 121 and the storage electrode lines 131 may have a multi-layered structure including two conductive layers (not shown) having different physical properties. In one exemplary embodiment, one of the two conductive layers may be made of a refractory metal. The other conductive layer may be made of a metal having low resistivity. Exemplary embodiments of the metal may include, but are not limited to, an aluminum-based metal such as aluminum (Al) and an aluminum alloy, a silver-based metal such as silver (Ag) and an silver alloy, and a copper-based metal such as copper (Cu) and a copper alloy, in order to reduce signal delay or voltage drop of the gate lines 121 and the storage electrode lines 131. In another exemplary embodiment, it is preferred that there is a double-layered structure which is a combination of a lower aluminum (alloy) layer and an upper chromium (or molybdenum) (alloy) layer.

In exemplary embodiments, side surfaces of the gate lines 121 may be slanted with respect to a surface of the substrate 110. In one exemplary embodiment, it is preferable that the slanted angle is in a range of about 30° to about 80°.

An interlayer insulating layer 160 is formed on the gate lines 121. The interlayer insulating layer 160 may be made of an inorganic insulating material such as a silicon nitride and a silicon oxide, an organic insulating material, a low-dielectric-constant insulating material, a combination including at least one of the foregoing or any material that is suitable for the purposes described herein. In exemplary embodiments, the dielectric constant of the low-dielectric-constant insulating material is 4.0 or less. In one illustrative exemplary embodiment, the low-dielectric-constant insulating material may be a-Si:C:O or a-Si:O:F which is formed by using a plasma enhanced chemical vapor deposition (PECVD) process. An interlayer insulating layer 160 is made of an organic insulating material having photosensitivity. A surface of the interlayer insulating layer 160 may be planarized. In addition, the interlayer insulating layer 160 may have a double-layer structure of a lower inorganic layer and an upper organic layer in order to protect exposed portions of the line-shaped semiconductors 154 as well as to have advantages of the organic layer.

Contact holes 163 and 165 are formed in the interlayer insulating layer 160 by removing a portion of the insulating layer 154b and a portion of the conductive member 154c at both ends of each of the line-shaped semiconductors 154 to expose the core 154a.

A plurality of data lines 171 and a plurality of drain electrodes 175 are formed on the interlayer insulating layer 160.

The data lines 171 for transmitting the data signals extend in a transverse direction substantially perpendicularly to intersect the gate lines 121 The data lines 171 include source electrodes 173 which are connected through the contact holes 163 to the cores 154a of the line-shaped semiconductors 154.

An end portion of each of the data lines 171 may have an enlarged area in order to be connected to other layers or external driving circuits (not shown). In an illustrative exemplary embodiment, a data driving circuit (not shown) for generating the data signals may be integrated on the substrate 110 and the data lines 171 may be directly connected to the data driving circuit.

Each drain electrode 175 is separated from a source electrode 173 and is connected through a contact hole 165 to the core 154a of a line-shaped semiconductor 154. In exemplary embodiments, the data lines 171 and the drain electrodes 175 may be constructed with a conductive layer made of an aluminum-based metal, a silver-based metal, a copper-based metal, a molybdenum-based metal, chromium (Cr), titanium (Ti), or tantalum (Ta), or alloys thereof. In alternative exemplary embodiments, the data lines 171 and the drain electrodes 175 may have a multi-layered structure including two conductive layers (not shown) having different physical properties. In one exemplary embodiment, one of the two conductive layers may be made of a metal having low resistivity, including, but not limited to, an aluminum-based metal, a silver-based metal, and a copper-based metal, in order to reduce signal delay or voltage drop. The other conductive layer may be made of a material having good physical, chemical, and electrical contact characteristics with other materials, particularly to ITO (indium tin oxide) and IZO (indium zinc oxide), such as a molybdenum-based metal, chromium, titanium, and tantalum. In another exemplary embodiment, it is preferred that there are a combination of a lower chromium layer and an upper aluminum (alloy) layer and a combination of a lower aluminum (alloy) layer and an upper molybdenum (alloy) layer.

Side surfaces of the data lines 171 and the drain electrodes 175 are slanted with respect to the surface of the substrate 110. In exemplary embodiments, the slanted angle is in a range of about 30° to about 80°. A passivation layer 180 is formed on the data lines 171, the drain electrodes 175, and the interlayer insulating layer 160. In exemplary embodiments, the passivation layer 180 may be constructed with the same material as the interlayer insulating layer 160. The passivation layer 180 includes a plurality of contact holes 185 exposing the drain electrodes 175.

Pixel electrodes 190 may include a transparent conductive material such as ITO (indium tin oxide) and IZO (indium zinc oxide), or an opaque reflective conductive material such as aluminum (Al) and silver (Ag).

The pixel electrodes 190 are connected through the contact holes 185 to the drain electrodes 175, and are applied with the data voltage from the drain electrodes 175.

The pixel electrodes 190 applied with the data voltage together with a common electrode (not shown) that applied with the common voltage generate an electric field, so that the liquid crystal molecules of the liquid crystal layer (not shown) between the two electrodes are aligned. In addition, when a current flows through a light emitting layer (not shown) between the two electrodes, light can be emitted.

The pixel electrodes 190 and the common electrode which is disposed on the display panel facing the pixel electrodes 190 constitute capacitors (hereinafter, referred to as "liquid crystal capacitors") to sustain the applied voltages even when the thin film transistors are turned off. In order to increase the voltage storage capability, another capacitor connected in parallel to the liquid crystal capacitor is provided, and this capacitor is called a storage capacitor. Storage capacitors are constructed by overlapping the pixel electrodes 190 and the storage electrode lines 131. In exemplary embodiments in order to increase electric capacitance of the storage capacitors, that is, storage capacitance, the storage electrode lines 131 may include storage electrodes 133 with an enlarged width in comparison to other portions of the storage electrode lines 131. In alternative exemplary embodiments, the storage capacitors may be constructed by overlapping the pixel electrodes 190 with the adjacent gate lines 121 (hereinafter, referred to as "previous gate lines").

In exemplary embodiments, the passivation layer 180 may include a low-dielectric-constant organic material and the pixel electrodes 190 may be constructed by overlapping the data lines 171 with the gate lines 121, such that an aperture ratio may be increased.

In an exemplary embodiment according to the present invention, since the line-shaped semiconductors 154 may be made of single-crystal silicon having high mobility, the thin film transistor may have an improved driving performance compared to that of a thin film transistor using amorphous silicon or polysilicon. Advantageously, the thin film transistor can be used as a switching device for turning the data voltage applied to the pixel on and off and as a driving device constituting a gate driving circuit and a data driving circuit. In other exemplary embodiments, when thin film transistors for switching pixels are formed in the thin film transistor display panel, the gate and data driving circuits may be formed together with the thin film transistors for switching pixels.

An exemplary embodiment of a method of manufacturing the thin film transistor display panel shown in FIGS. 1 to 4 will be described in detail with reference to FIGS. 5 to 14B together with FIGS. 1 to 4.

Figure 5:
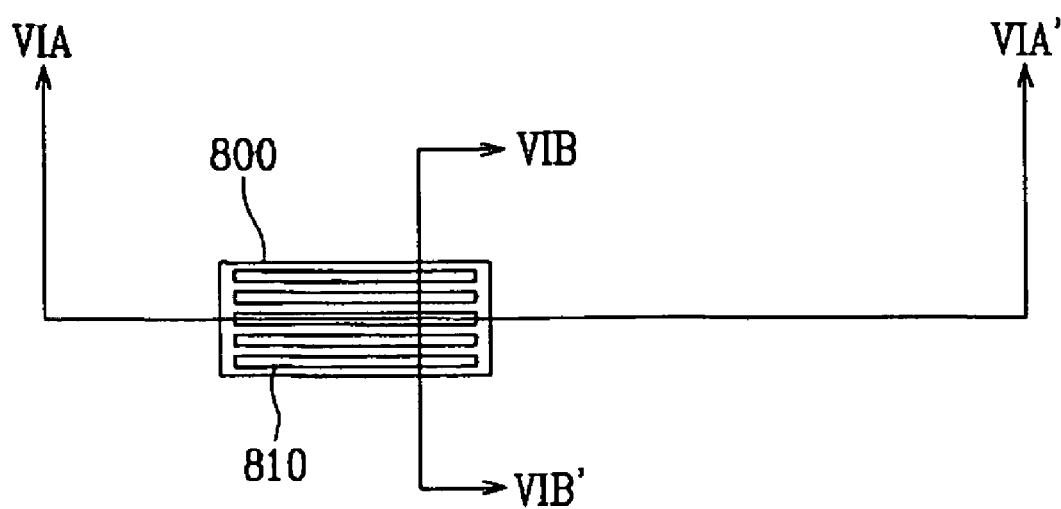
FIG. 5 is a layout view showing an exemplary embodiment of an intermediate step of a method of manufacturing the thin film transistor display panel for the liquid crystal display apparatus shown in FIGS. 1 to 4 according to the present invention.
Figure 6A:
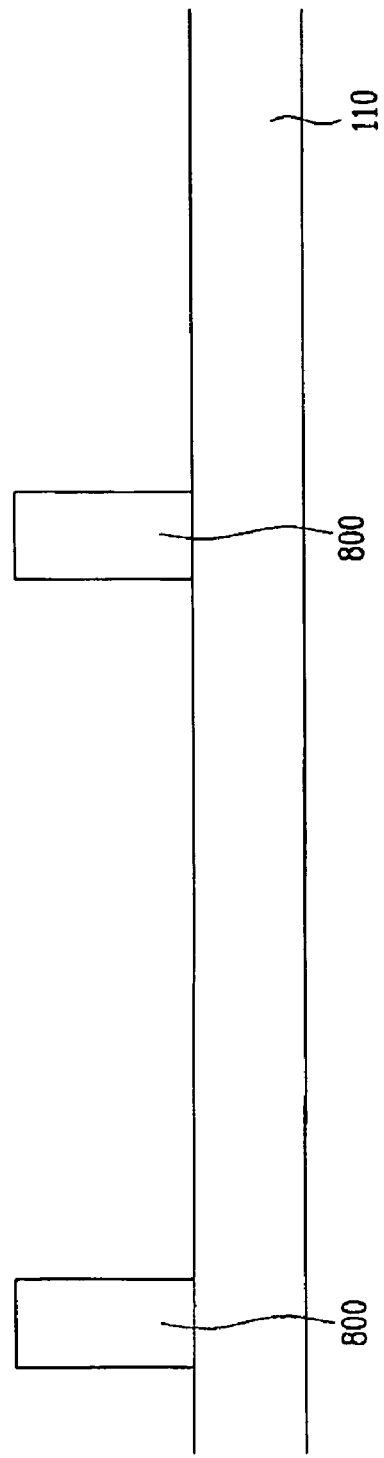
Figure 7A:
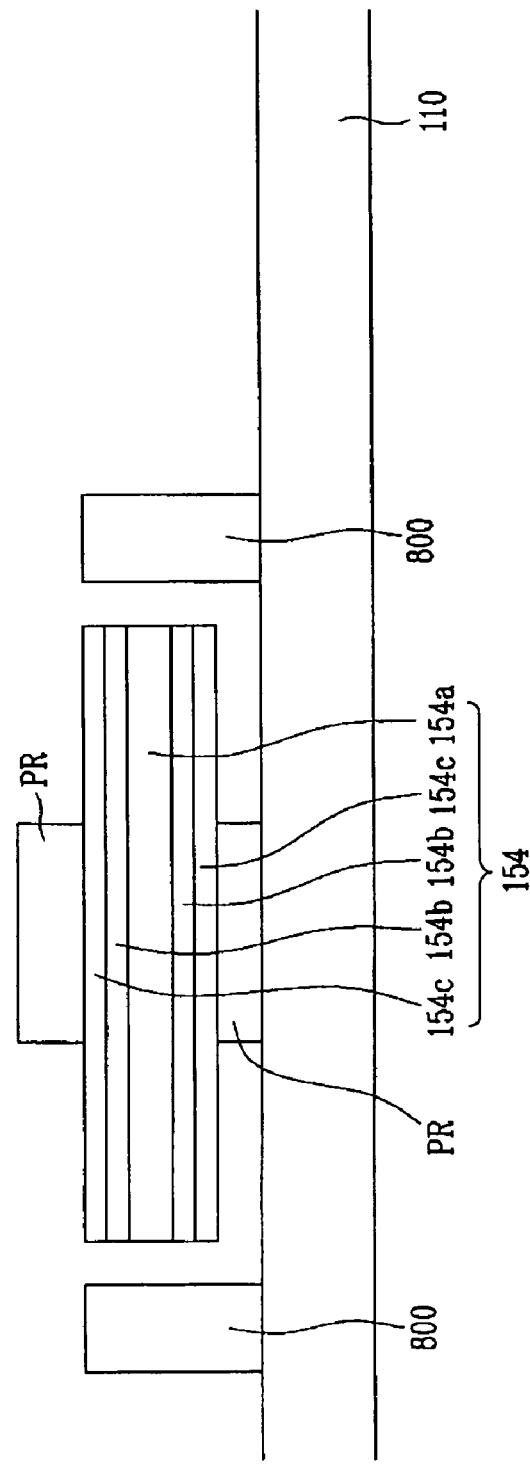
FIGS. 7A and 7B are cross-sectional views of the thin film transistor display panel showing exemplary embodiments of steps of a method of manufacturing following steps shown in FIGS. 6A and 6B.
Figure 7B:
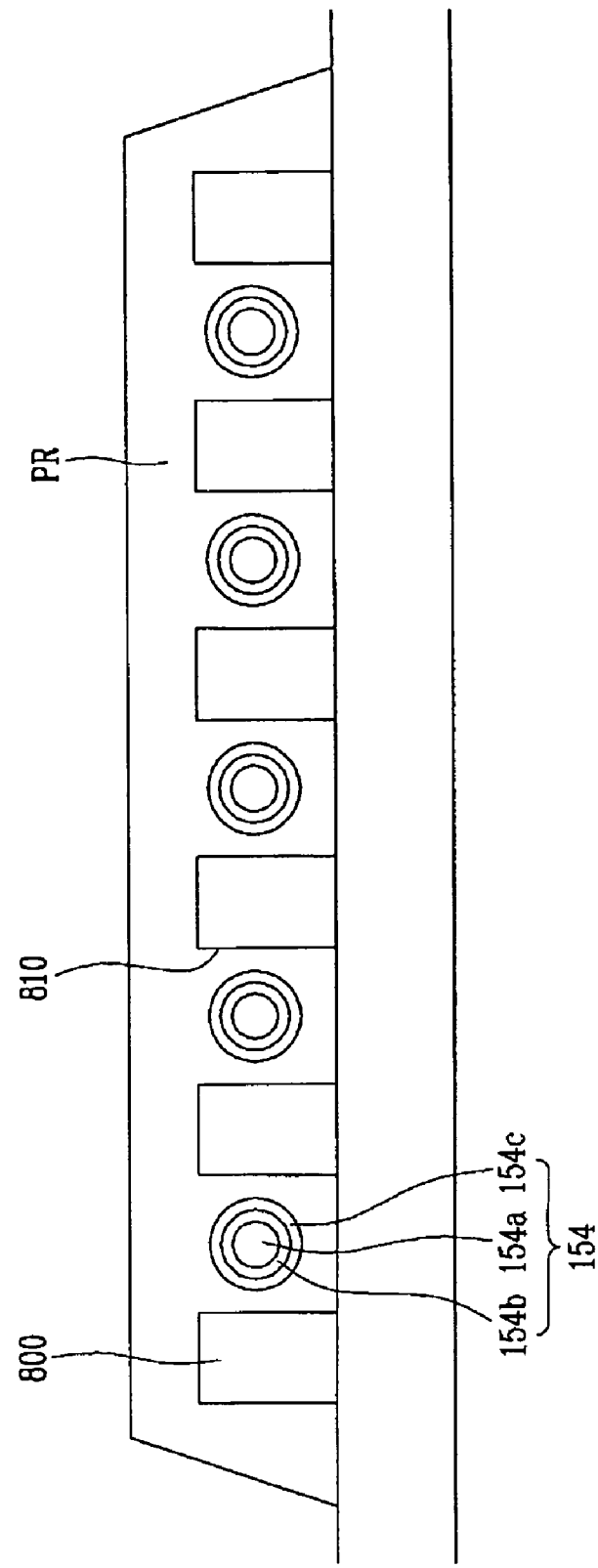
Figure 11:
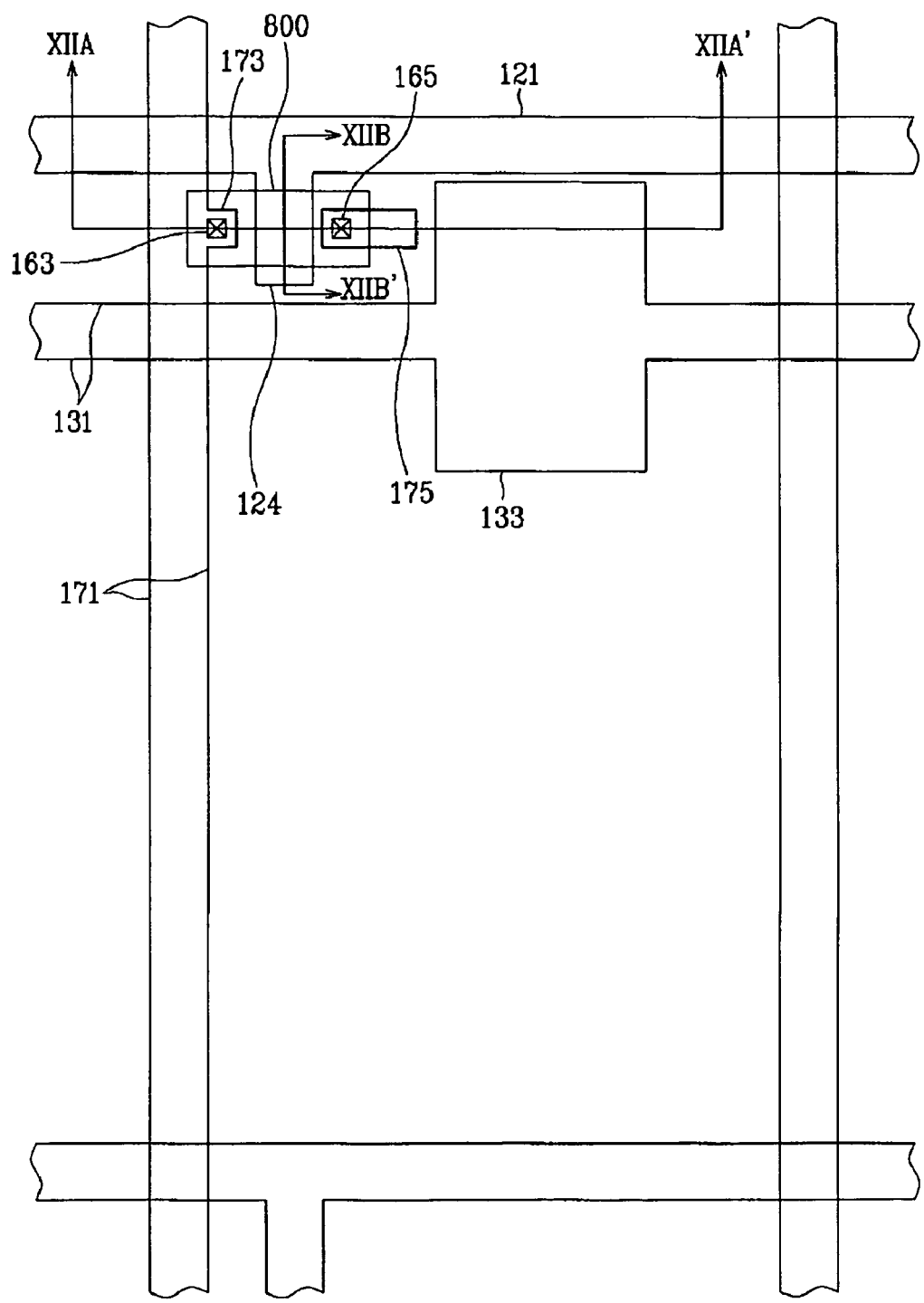
FIG. 11 is a layout view of the thin film transistor display panel showing an exemplary embodiment of a step of a manufacturing method following the step shown in FIG. 9.
Figure 12A:
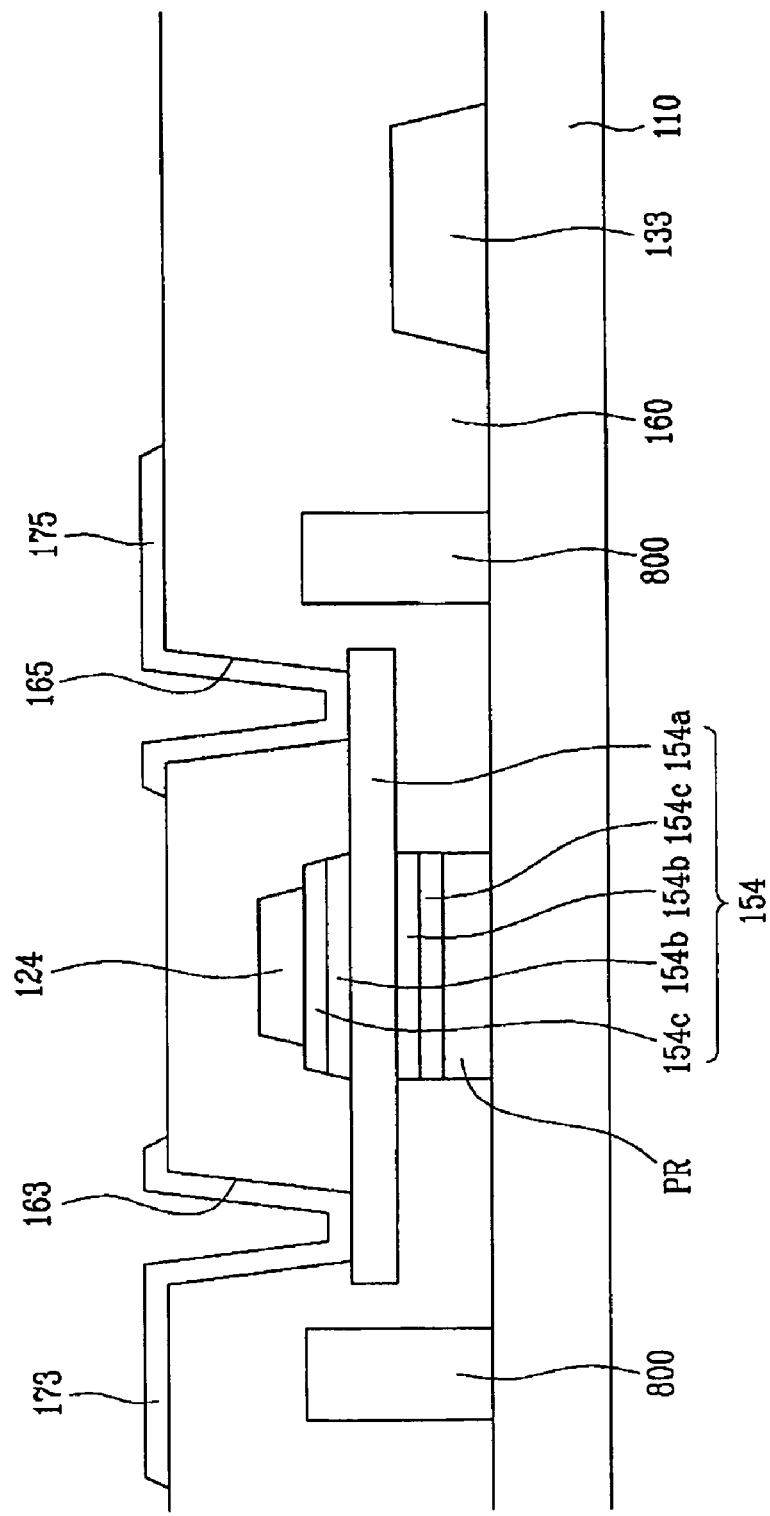
Figure 13:
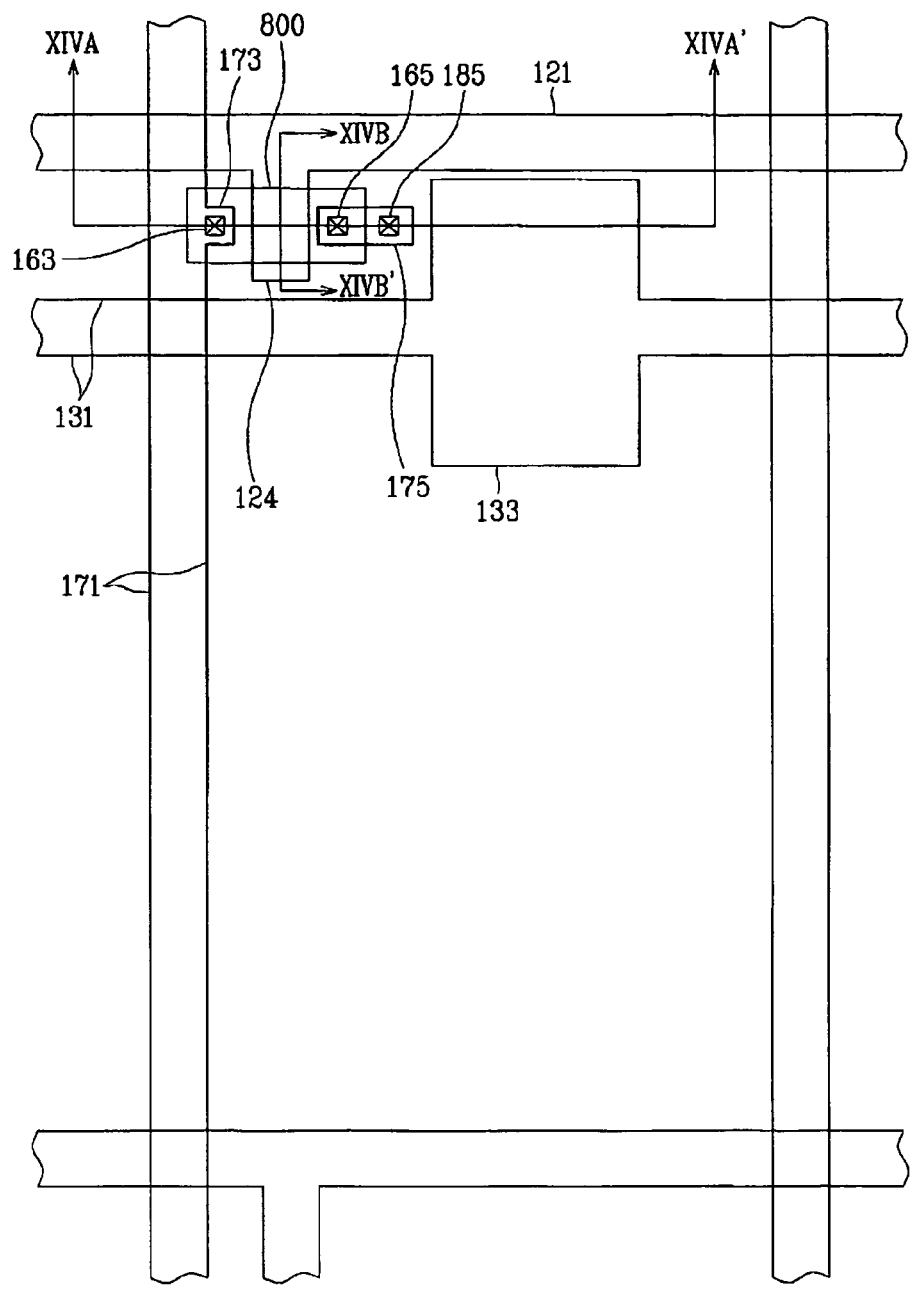
FIG. 13 is a layout view of an exemplary embodiment of the thin film transistor panel showing an exemplary embodiment of a step of a manufacturing method following the step shown in FIG. 11.
Figure 14A:
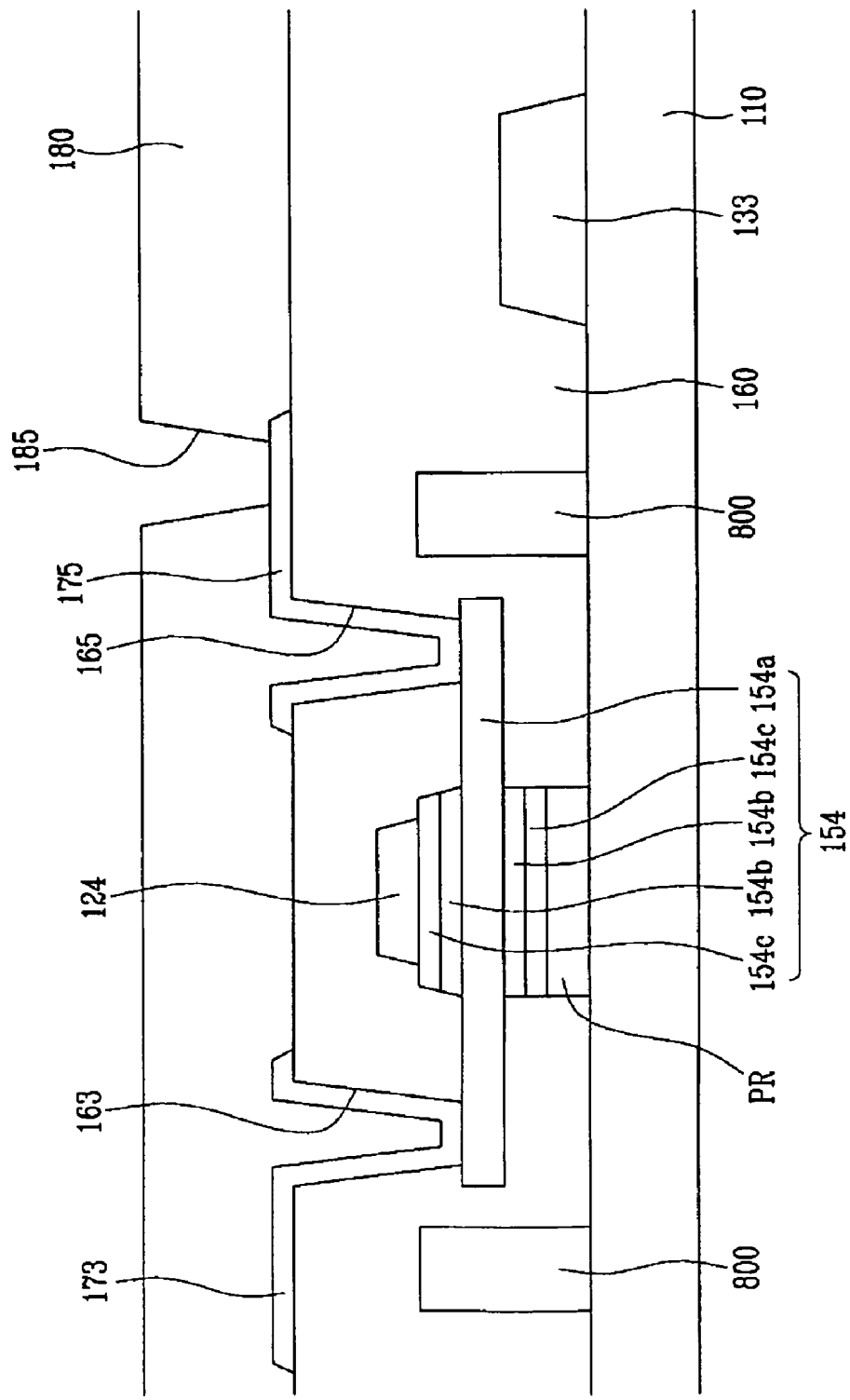

FIG. 5 is a layout view showing an exemplary embodiment of an intermediate step of a method of manufacturing the thin film transistor display panel for the liquid crystal display apparatus shown in FIGS. 1 to 4 according to the present invention, FIGS. 6A and 6B are cross-sectional views of the thin film transistor display panel taken along lines VIA-VIA' and VIB-VIB' of FIG. 5, respectively, and FIGS. 7A and 7B are cross-sectional views of the thin film transistor display panel showing exemplary embodiments of steps of a manufacturing method following steps shown in FIGS. 6A and 6B. FIGS. 8A and 8B are cross-sectional views of the thin film transistor display panel showing exemplary embodiments of steps of a manufacturing method following steps shown in FIGS. 7A and 7B, FIG. 9 is a layout view showing an exemplary embodiment of the thin film transistor display panel in an exemplary embodiment of a step of a manufacturing method following the steps shown in FIGS. 8A and 8B, and FIGS. 10A and 10B are exemplary embodiments of the thin film transistor display panel cross-sectional views of the thin film transistor display panel taken along lines XA-XA' and XB-XB' of FIG. 9, respectively. FIG. 11 is a layout view of the thin film transistor display panel showing an exemplary embodiment of a step of a manufacturing method following the step shown in FIG. 9, FIGS. 12A and 12B are cross-sectional views of the thin film transistor display panel taken along lines XIIA-XIIA' and XIIB-XIIB' of FIG. 11, respectively, FIG. 13 is a layout view of an exemplary embodiment of the thin film transistor display panel showing an exemplary embodiment of a step of a manufacturing method following the step shown in FIG. 11, and FIGS. 14A and 14B are exemplary embodiments of the thin film transistor panel cross-sectional views of the thin film transistor display panel taken along lines XIVA-XIVA' and XIVB-XIVB' of FIG. 13, respectively.

Referring to FIGS. 5 to 6B, an organic layer made of an organic material having photosensitivity is formed on a transparent dielectric substrate 110. Next, the organic layer is patterned by using a photo process to form frames 800 having grooves 810. The grooves 810 may be formed so as to expose the substrate. In alternative exemplary embodiments, the grooves 810 may be formed to leave a portion of the organic material on the bottoms of the grooves 810.

In other alternative exemplary embodiments, where the organic material for forming the frames 800 has no photosensitivity, the organic layer may be patterned by using a photolithography process using a photosensitive pattern to form the grooves 810.

Referring to FIGS. 7A and 7B, a photosensitive layer is formed on a substrate 110 by applying a photosensitive material. The photosensitive material constructed by inserting the line-shaped semiconductors 154 into the organic material having photosensitivity. The line-shaped semiconductors 154 are aligned substantially in the longitudinal direction of the grooves 810. The line-shaped semiconductors 154 contact the substrate 110 or may be not contact the substrate 110, being floated in a photosensitive layer.

A photosensitive pattern PR is formed on the frames 800 by using a photo process. Forming the photosensitive pattern PR essentially exposes ends of the line-shaped semiconductors 154 as illustrated in FIG. 7A.

By using the photosensitive pattern PR essentially as an etch mask, a conductive layer 154c and an insulating layer 154b exposed in the line-shaped semiconductors 154 are removed.

Referring to FIGS. 8A and 8B, removing the photosensitive pattern PR may be performed by using a dry etching process or an ashing process. In an exemplary embodiment, the photosensitive pattern PR is over-etched until ½ to ⅔ of the underlying conductive member 154c is exposed. In alternative exemplary embodiments, the upper portions of the frames 800 may be partially removed.

Referring to FIGS. 9 to 10B, a conductive layer is formed on the substrate 110 by using a sputtering process, and then the conductive layer is patterned to form gate lines 121 including gate electrodes 124 and storage electrode lines 131 including storage electrodes 133.

Referring to FIGS. 11 to 12B, an insulating material is layered to cover the gate lines 121 and the storage electrode lines 131 to form an interlayer insulating layer 160. Contact holes 163 and 165 are formed in the interlayer insulating layer 160 to expose both ends of the line-shaped semiconductors 154. In exemplary embodiments, contact holes 163 and 165 may be formed by a photo process or a photolithography process.

A conductive layer is formed, and then the conductive layer is patterned to form data lines 171 that are connected through the contact holes 163 to the cores 154a of the line-shaped semiconductors 154 and drain electrodes 175 that are connected through the contact holes 165 to the cores 154a of the line-shaped semiconductors 154. In exemplary embodiments, the conductive layer may be formed by using a sputter process.

Referring to FIGS. 13 to 14B, a passivation layer 180 is formed to cover the data lines 171 and the drain electrodes 175, and then contact holes 185 are formed. In exemplary embodiments, the contact holes 185 may be formed by using a photo process. In alternative exemplary embodiments, where the passivation layer 180 has no photosensitivity, the contact holes 185 may be formed by using a photolithography process using a separate photosensitive pattern.

Finally, referring to FIGS. 1 and 3, a transparent conductive material such as ITO and IZO and a metal having good reflectance may be deposited on the passivation layer 180. In exemplary embodiments, pixel electrodes 190 may be formed by a patterning process. The pixel electrodes 190 are connected through the contact hole 185 to the drain electrodes 175.

In an exemplary embodiment according to the present invention, complicated processes such as an impurity doping process and a crystallizing process are reduced or essentially eliminated from a conventional process of manufacturing a thin film transistor. Advantageously, it is possible to simplify the process for manufacturing the thin film transistor display panel.

In another exemplary embodiment according to the present invention, the line-shaped semiconductors are regularly aligned by forming the frames, so that the line-shaped semiconductors can accurately overlap with the gate electrodes and be connected to the source and drain electrodes.

Figure 15:
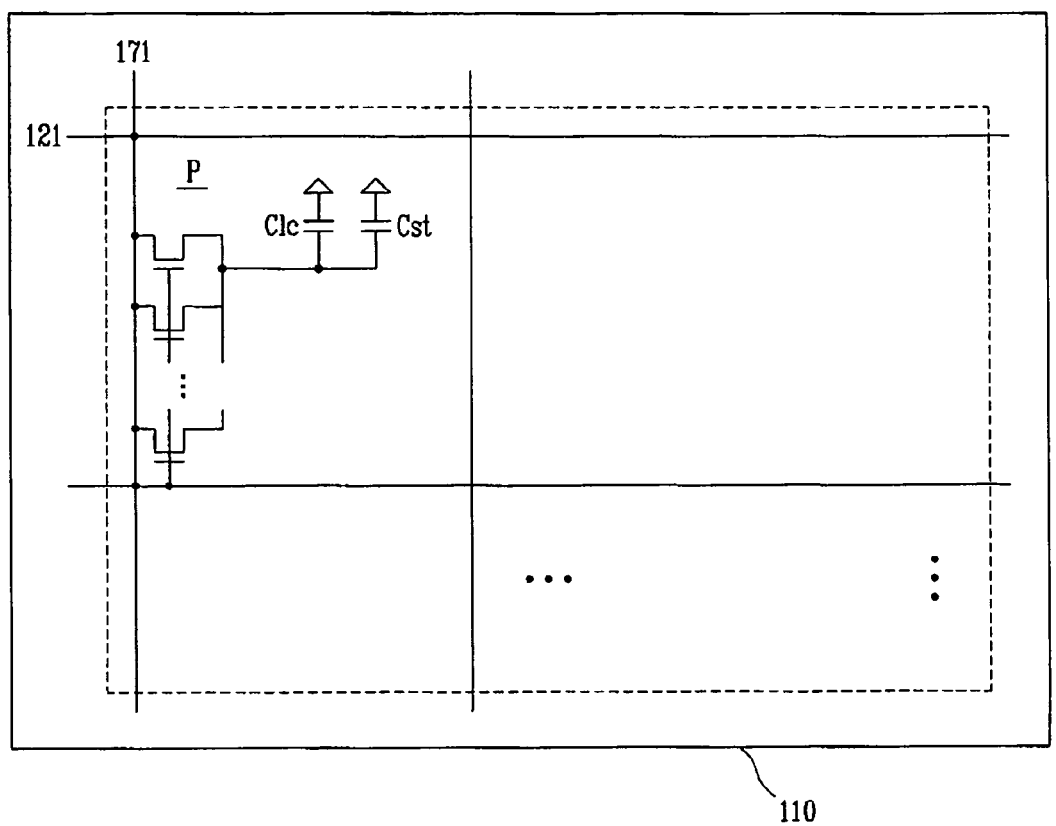
FIG. 15 is a schematic equivalent circuit diagram of an exemplary embodiment of the thin film transistor display panel according to the present invention.

FIG. 15 is a schematic equivalent circuit diagram of an exemplary embodiment of the thin film transistor display panel according to the present invention.

Referring to FIGS. 1 to 4, a plurality of the thin film transistors are formed in a single pixel P. In an exemplary embodiment according to the present invention, channels are individually formed for the line-shaped semiconductors, such that a plurality of the thin film transistors are connected in parallel.

When the frames, the source electrodes, and the drain electrodes are formed substantially similar in size as the semiconductors in a conventional thin film transistor display panel, the source and drain electrodes may be connected to a plurality of the line-shaped semiconductors, such that a plurality of the thin film transistors can be formed as shown in FIG. 15.

In this way, a plurality of the thin film transistors connected in parallel is provided to a single pixel. Advantageously, if one thin film transistor malfunctions, the pixel P can be driven by another thin film transistor.

In another exemplary embodiment, the line-shaped semiconductors may be of nanometer-size. Advantageously, when the thin film transistor is formed by using a small number of line-shaped semiconductors, the area of the thin film transistors occupying the pixel can be greatly reduced. Accordingly, the aperture ratio of pixels may be increased.

In another exemplary embodiment since the thin film transistor is formed by using the line-shaped semiconductors, the driving performance of the thin film transistor may be improved. Advantageously, a driving circuit may be directly formed on an upper portion of the substrate. In addition, the production process can be simplified so that it is possible to minimize production cost.

In another exemplary embodiment, since a plurality of the thin film transistors are formed in a single pixel without a decrease in aperture ratio, defective pixels caused by defects of the thin film transistors may be minimized, such that production yield of the thin film transistor display panel can be improved.

Although exemplary embodiments and modified examples of the present invention have been described, the present invention is not limited to the embodiments and examples, but may be modified in various forms without departing from the scope of the appended claims, the detailed description, and the accompanying drawings of the present invention. Therefore, it is natural that such modifications belong to the scope of the present invention.

What is claimed is:

1. A thin film transistor comprising:
    a frame, corresponding to a single thin film transistor, formed on a substrate and having a plurality of grooves, each of the grooves extending in a direction;
    a plurality of line-shaped semiconductors disposed in the grooves, each of the line-shaped semiconductors elongated from a first end to a second end along the extending directions of the grooves and separately disposed in each of the grooves;
    a photosensitive pattern disposed in the grooves, the photosensitive pattern contacting the line-shaped semiconductor;
    a first electrode overlapping each of the line-shaped semiconductors;
    a second electrode connected to the first ends of each of the line-shaped semiconductors; and
    a third electrode connected to the second ends of the line-shaped semiconductors,
    wherein the grooves expose a portion of the substrate.

2. The thin film transistor of claim 1, wherein each of the line-shaped semiconductors comprises a cylindrical core comprising single-crystal silicon, an insulating layer wrapping a cylindrical surface of the core, and a conductive layer surrounding the insulating layer.

3. The thin film transistor of claim 2,
    wherein end portions of the core are exposed, and
    wherein the second and third electrodes contact the exposed end portions of the core.

4. The thin film transistor of claim 1, wherein a height of the grooves is 2 µm or less.

5. The thin film transistor of claim 1, wherein an interval between adjacent grooves is in a range of about 2 µm to about 4 µm.

6. The thin film transistor of claim 1, wherein the grooves extend substantially parallel to each other.

7. A thin film transistor display panel comprising:
    a substrate; and
    a plurality of thin film transistors disposed on the substrate, each of the plurality of thin film transistors comprising:
        a frame formed on the substrate and having a plurality of grooves;
        a plurality of line-shaped semiconductors disposed in the grooves, each of the line-shaped semiconductors elongated from a first end to a second end along a longitudinal direction of the grooves and separately disposed in each of the grooves;
        a photosensitive pattern disposed in the grooves, the photosensitive pattern contacting the line-shaped semiconductor;

a gate line overlapping the line-shaped semiconductors;
a data line connected to the first ends of the line-shaped semiconductors;
a drain electrode connected to the second ends of the line-shaped semiconductors; and
a pixel electrode connected to the drain electrode,
wherein the grooves expose a portion of the substrate.

8. The thin film transistor display panel of claim 7, wherein each of the line-shaped semiconductors comprises a cylindrical core comprising single-crystal silicon, an insulating layer wrapping a cylindrical surface of the core, and a conductive layer surrounding the insulating layer.

9. The thin film transistor display panel of claim 8, wherein end portions of the core are exposed, and
wherein the data line and the drain electrode are in contact with the exposed portions of the core.

10. The thin film transistor display panel of claim 7, wherein the frame comprises a transparent organic material.

11. The thin film transistor display panel of claim 7, wherein a height of the grooves is 2 μm or less.

12. The thin film transistor display panel of claim 7, wherein an interval between adjacent grooves is in a range of 2 μm to 4 μm.

13. The thin film transistor display panel of claim 7, wherein a planar side of the frame is about 4 μm to about 10 μm.

14. The thin film transistor display panel of claim 7, wherein the grooves extend substantially parallel to each other.

* * * * *